United States Patent [19]

Salensky et al.

[11] Patent Number: 5,039,472
[45] Date of Patent: Aug. 13, 1991

[54] ADHESION PROMOTER FOR THERMOPLASTIC SUBSTRATES AND METHOD EMPLOYING SAME

[75] Inventors: George A. Salensky, Whitehouse Station; Thomas S. Thoman, Cranford, both of N.J.

[73] Assignee: Amoco Corporation, Chicago, Ill.

[21] Appl. No.: 343,745

[22] Filed: Apr. 27, 1989

Related U.S. Application Data

[63] Continuation-in-part of Ser. No. 214,380, Jul. 1, 1988.

[51] Int. Cl.$^5$ ............................................. B29C 71/00
[52] U.S. Cl. .................................... 264/341; 106/311; 156/83; 156/240; 156/281; 156/309.3; 252/364
[58] Field of Search .............. 264/341; 156/83, 309.3, 156/240, 281; 106/311; 252/364

[56] References Cited

U.S. PATENT DOCUMENTS

| | | | |
|---|---|---|---|
| 2,153,895 | 4/1939 | McKittrick et al. | 252/364 |
| 3,625,763 | 12/1971 | Melillo | 252/364 |
| 4,056,403 | 11/1977 | Cramer et al. | 252/364 |

*Primary Examiner*—John J. Gallagher
*Attorney, Agent, or Firm*—Morgan & Finnegan

[57] ABSTRACT

This invention relates to an adhesion promoting composition and method for its use for promoting adhesion of printed circuits on thermoplastic substrates. The composition includes isopropanol with either methylene chloride or resorcinol. An added ingredient includes polycyclohexanone. The preferred substrate is polyarylsulfone.

24 Claims, No Drawings

ADHESION PROMOTER FOR THERMOPLASTIC SUBSTRATES AND METHOD EMPLOYING SAME

RELATED APPLICATIONS

This application is a continuation-in-part of U.S. application Ser. No. 214,380, filed July 1, 1988 entitled "Solderable Printed Circuits Formed Without Plating". The applications are commonly assigned. This application is incorporated by reference.

FIELD OF THE INVENTION

This invention relates to an adhesion promotor composition and process for promoting adhesion of an electric circuit or patterned conductor to a thermoplastic substrate.

BACKGROUND OF THE INVENTION

Methylene chloride is a known solvent for surface treatment of substrates. It is known for use in degreasing substrates as well as in cleaning substrates in preparation for electroplating conventional metal and plastic substrates. The techniques used to clean such substrates are conventional. Typically, the choice of the appropriate cleaning or preparative cycle depends primarily upon the nature of the substrate to be prepared and the nature and amounts of the soil to be removed. Organic compounds, such as methylene chloride, are used to dissolve most oils and greases including those used to bind buffing and polishing compounds. One typical problem in using organic cleaners is that removal of oils and greases from a highly contaminated surface, may merely leave the non-oily dirt dry and more firmly attached. According to known methods, hot solvent vapors melt or plasticize and reflow the surface of the substrate. This effects clarity in surface finish.

Although organic solvents may be used merely as dips, it is more common and effective to employ vapor degreasing, in which vapors of the solvent condense on the parts to be cleaned and run back into a pool of liquid solvent below them. Methylene chloride is a common solvent for this purpose.

In choosing a vapor degreasing solvent, EPA regulations and relative toxicity must be balanced against cost. In any case, necessary precautions dictate that no one must enter a vapor degreaser for repair or cleaning without life-support and a partner outside for emergencies. Thus, the disadvantage of such a process involves the requirement of specialized equipment to prevent escape of toxic vapors into the work area.

Applicants have developed an adhesion promoting composition, which overcomes disadvantages found in the prior art.

SUMMARY OF THE INVENTION

This invention relates to an adhesion promoting composition for thermoplastic substrates comprising an effective concentration of isopropanol and methylene chloride to promote adhesion.

This invention also relates to a process for promoting adhesion to a thermoplastic substrate comprising treating the substrate prior to adhesion with an effective concentration of isopropanol with methylene chloride to promote adhesion.

This invention further relates to an adhesion promoting composition for thermoplastic substrates comprising an effective concentration of isopropanol in resorcinol to promote adhesion.

This invention also further relates to a process for promoting adhesion to a thermoplastic substrate comprising treating the substrate prior to adhesion with an effective concentration of isopropanol with resorcinol to promote adhesion.

DETAILED DESCRIPTION OF THE INVENTION

The present invention relates to manufacture of printed circuitry without using a plating step to make the circuitry solderable. In this regard, the manufacturer utilizes conventional thick-film printing techniques to image circuit patterns on a release substrate for subsequent adherence to a molded substrate. As mentioned in the related application, a new conductive ink and a new adhesive which obviates the need for a plating step required by other processes to make the circuit solderable are taught. These materials are transferred to a substrate to provide a metal rich surface suitable for conventional soldering. The present invention is directed to an adhesion promotor for thermoplastic substrates, such as polyarylsulfone substrates, to which the circuit patterns are adhered.

Printing a conductive ink on a release medium in a form of a solderable electrical circuit which is then preferably overcoated in registration with an adhesive for subsequent transfer to a substrate has been discovered. This article can be directly soldered. Applicants have discovered a new adhesion promotor which surprisingly improves the adhesion of the circuit to the substrate. Applicants' contribution is best considered in connection with the manufacturing process described above.

INVENTIVE TRANSFER PROCESS FLOW CHART

1) Print and Dry Circuit on Releasable Medium
2) Print and Dry Adhesive on Circuit
3) Prepare And Dry Substrate
4) Transfer Circuit To Substrate
5) Oven Cure Substrate Article With Transferred Circuit
6) Apply Flux to Circuit Article
7) Pre-heat Circuit Article
8) Solder Circuit Article After the conductor is printed and dried on the release paper, an adhesive is applied, preferably in registration, over the printed conductor. The release paper with the printed circuit and the adhesive is dried. Drying can be done at 96° C. in a forced convection oven for ten minutes to evaporate solvent in the printed ink circuit. A conveyor oven or infrared oven is used to reduce drying time. This provides the required cure for adhesion development to the substrate during the transfer step. About three minutes are needed for this step. The adhesive complements the ink, that is, it is formulated to chemically interact with the ink and the binder used in the ink formulation.

The substrate is treated to facilitate transfer of the printed circuit to it. The surface of the substrate is prepared essentially instantaneously. No stress cracking of the substrate is apparent using the present process.

In the present vapor polishing technique, the substrate surface is exposed to vapors of a solvent. The surface is exposed to the vapors usually in a container, so that the entire surface area is contacted by the vapors. The surface is contacted until a desired surface finish is obtained. This contact time is between 0.5 and about 3 seconds. However, according to the invention, the substrate is immersed in a solvent at about room temperature or lower for about 3 minutes to get a uniform substrate surface. Then, the treated substrate is air dried or dried under vacuum.

Thereafter, the conductive ink and the adhesive are transferred to the substrate. This is done using heat and pressure for three minutes. During the transfer process, the adhesive, substrate surface and ink binder all chemically react to form a thermally resistant bond. Then, the circuit/substrate unit or article is heated for about 30 minutes at 150° C. to cure it further.

Afterwards, flux is applied to the circuit and the article is preheated. Then, the circuit is soldered to connect electrical leads to the circuit. Soldering can be done using a conventional wave solder technique at about 6 ft/min and at 246° C. solder bath temperature, using a preheat temperature of 135°-138° C. as measured on the top of the circuit board with a thermocouple. Overall, the processing conditions are conventional to those skilled in the art.

With those general thoughts in mind, applicants teach a surprisingly better technique for preparing the substrate surface using a solvent which unexpectedly improves adhesion for thermoplastic substrates, especially polyarylsulfone substrates.

As pointed out above, to obtain uniform solder adhesion of thermoplastic substrates, it is necessary to vapor polish or prepare the substrate prior to transfer of printed circuit to it. A room temperature or cold bath is developed by applicants which requires approximately three minutes to prepare substrates prior to having a circuit transferred to it. This dip comprises a composition including isopropyl alcohol. This mixture has two embodiments, one of which includes methylene chloride as another constituent of the mixture and the other embodiment which includes resorcinol. Each of the embodiments can also include a polycyclohexanone resin.

The concentration of the mixture in the embodiment including methylene chloride is preferably about a 50 percent mixture of each of the two components and at least about 50% methylene chloride. That means that the concentration of isopropyl alcohol is less than about 50% of the mixture. As mentioned, about one and one half percent polycyclohexanone resin can be included in the mixture for this embodiment. For the latter embodiment, the mixture preferably includes almost all isopropyl alcohol with approximately one and one half percent resorcinol. As mentioned, this mixture can also include polycyclohexanone in a concentration of about ¾ of a percent, when ¾ of a percent resorcinol is used. Concentrations are percent by volume of the mixture.

Substrates are dipped for approximately three minutes at about room temperature, air or vacuum dried and have electric circuitry transferred to them for three minutes at 350° C. Thereafter, the plastic circuits are cured for thirty minutes at 150° C. and wave soldered at 118° C. While these operating conditions are preferred, other operating conditions can be utilized depending upon the particular substrate being used. These other conditions are well within the skill of a person knowledgeable in the art.

Substrate Surface

The substrate may be any known thermoplastic dielectric, that is, insulating or non-conducting substrate. Preferred thermoplastic substrates will be taught below.

In general, thermoplastics exhibit a more complex range of chemical, thermal, and mechanical behavior than traditional thermoset materials. This makes material selection for printed circuit use even more critical. Current resin systems typically exhibit one or two desired characteristics but, in general, lack the overall property balance to make them good printed circuit support candidates. Resin deficiencies become readily apparent during assembly operations where substrate warpage, bubbling, dimensional instability and printed circuit delamination are common occurrences.

To address this need, applicants use engineering resins called polyarylsulfone. These resins offer a highly desirable property balance for circuit board uses where excellent dimensional stability, warp resistance and bonding of circuit and substrate are requirements.

Polyarylsulfone resins are characterized by inherently high heat distortion temperatures, excellent dimensional stability, creep resistance, low loss AC dielectric properties, and high mechanical strength.

| Typical Properties of Polyarylsulfone Resins | | |
|---|---|---|
| Property | Units | Typical Property |
| Tensile Strength | psi | 13,400 |
| Elongation to Break | % | 2.2 |
| Tensile Modulus | psi | 892,000 |
| Flexural Strength | psi | 19,300 |
| Heat Deflection Temperature | °C. | 215 |
| Density | gm/cc | 1.55 |
| AC Dielectrics | | |
| Dielectric Constant | | |
| 60 Hz | — | 3.86 |
| 1 KHz | — | 3.85 |
| Dissipation Factor | | |
| 60 Hz | — | 0.0042 |
| 1 KHz | — | 0.0035 |
| Dielectric Strength ⅛" specimen | Volts/mil | 398-550 |
| Volume resistivity at 50° C. | meg ohm-cm | $0.41 \times 10^{11}$ |

Polyarylsulfone resins are easily processed utilizing standard injection molding machinery and practice. Prior to molding, resins should be dried to obtain optimum performance in a dehumidified hopper drier or circulating air oven. Utilization of a hopper drier is preferred with an inlet air temperature in the 149°-163° C. range and an outlet temperature not less than 135° C., all at a dew point of −29° C. When tray drying is utilized, pellets should be spread into a layer 1-2" in depth. It is important in all cases that the pellets reach and maintain a minimum temperature of 135° C. for 3-4 hours. Dried resin should be molded promptly and handled carefully to preclude moisture reabsorption.

The rheological characteristics of polyarylsulfone resins provide excellent flow for filling thin and intricate wall sections typically encountered in printed wiring boards, chip carriers, and related devices. The resins process readily at stock temperatures in the 360°-382° C. range (wave soldering grade). Mold temperatures of 110°-157° C. are used typically with the resin for wave solderable moldings. Clean polyarylsulfone resin scrap may be reground and utilized in fabrication, provided it is properly dried and kept free of contamination.

Polyarylsulfone produces warp-free moldings that are dimensionally stable both prior to and following the transfer process. Transferred circuitry exhibits tenacious adhesion to the resin as transferred, and maintains its adhesion following wave soldering.

Additives which may be used with the thermoplastic and/or thermosetting resin for making the printed circuit board, include reinforcing and/or non-reinforcing fillers such as wollastonite, asbestos, talc, alumina, clay, mica, glass beads, fumed silica, gypsum and the like; and reinforcement fibers such as aramid, boron, carbon, graphite, and glass. Glass fiber is the most widely used reinforcement in the form of chopped or milled strands, ribbon, yarn, filaments, or woven mats. Mixtures of reinforcing and non-reinforcing fillers may be used, such as a mixture of glass fibers and talc or wollastonite. These reinforcing agents are used in amounts of from about 10 to 80 weight percent, whereas the non-reinforcing fillers are used in amounts of up to 50 weight percent. Other additives include stabilizers, pigments, flame retardants, plasticizers, processing aids, coupling agents, lubricants, mold release agents, and the like. These additives are used in amounts which achieve the desired result.

Polyarylsulfone

Polyarylsulfone is the preferred thermoplastic polymer substrate of the invention. It is an amorphous thermoplastic polymer containing units of the formula:

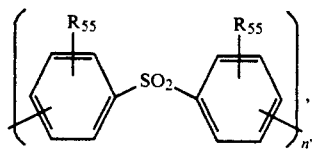  (I)

and/or

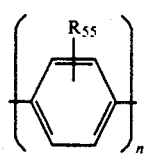  (II)

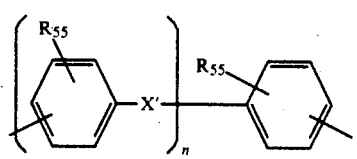  (III)

wherein $R_{55}$ is independently hydrogen, $C_1$ to $C_6$ alkyl to $C_4$ to $C_8$ cycloalkyl, X' is independently

wherein $R_{56}$ and $R_{57}$ are independently hydrogen or $C_1$ to $C_9$ alkyl, or

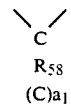

wherein $R_{58}$ and $R_{59}$ are independently hydrogen or $C_1$ to $C_8$ alkyl, and $a_1$ is an integer of 3 to 8; —S—, —O—, or

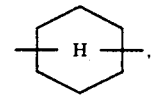

a is an integer of 0 to 4 and n is independently an integer of 1 to 3 and wherein the ratio of unit (I) to the sum of units (II) and/or (III) is greater than 1. The units are attached to each other by an —O— bond. A preferred polymer of this invention contains units of the formula:

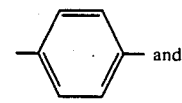 and

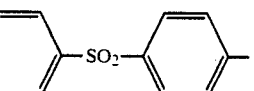

Another preferred polyarylsulfone of this invention contains units of the formula:

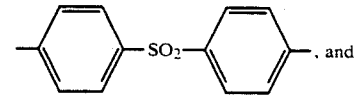, and

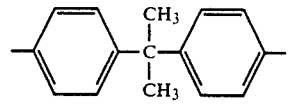

These units are attached to each other by an —O— bond.

The polyarylsulfone may be random or may have an ordered structure. The polyarylsulfones of this invention have a reduced viscosity of from about 0.4 to greater than 2.5, as measured in N-methylpyrrolidone, or other suitable solvent, at 25° C.

EXAMPLE

The invention will now be described with an example of the teaching set forth above. This example is exemplary and not exclusive. It is not considered limiting. Concentrations are percent by weight of the mixture unless otherwise indicated.

EXAMPLE 1

The following ingredients in percent by weight are blended together at room temperature:

1.81 percent polyhydroxyether known as Phenoxy PKFE, (II) 2.75 percent 3,4 epoxy cyclohexyl methyl 3,4 epoxy cyclohexyl carboxylate known as epoxy ERL-4221, and (III) 8.47 percent diethylene glycol monobutyl ether acetate known as butyl Carbitol acetate.

To this mixture is added the following ingredients:

(IV) 86.62 percent of silver powder from Metz Metallurgical Co. known as METZ EG200ED; and (V) 4.35 percent of silver flake also from Metz Metallurgical Co. known as METZ 50S.

More particularly, the phenoxy resin is dissolved in diethylene glycol monobutyl ether acetate with agitation. The epoxy resin is added to this mixture while agitation is continued. Then, silver powder is added to the mixture under continued agitation until it is dispersed to a Hegman grind of six. Then, the silver flake is added until it is also dispersed to a grind of six or better. The viscosity of the mixture is 35,000 cps. as determined with a Brooksfield RVT Viscometer at 24° C. using a number six spindle at 20 rpm. The 2.5/20 rpm viscosity ratio is 4. The conductive metal and binder are mixed together until completely homogenized to form an ink.

This conductive ink is screen printed (U.S. Sieve size 230), using conventional techniques, onto VNS Supermat release paper (obtained from S.D. Warren Co., Westbrook, Me.) to a thickness of approximately 1 mil after drying.

Separately, an adhesive containing the following ingredients is prepared:

| TRADE NAME | CHEMICAL NAME | NEW (WT. %) |
|---|---|---|
| PHENOXY PKFE | POLYHYDROXY ETHER | 18.99 |
| RESIMENE 2040 | MELAMINE FORMALDEHYDE | 0.95 |
| BUTYL CARBITOL ACETATE | DIETHYLENE GLYCOL MONO BUTYL ETHER ACETATE | 75.96 |
| BLACK SAPL | NIGROSINE BLACK | 0.19 |
| BENZOIC ACID | BENZOIC ACID | 0.05 |
| CABOSIL | SILICA | 3.86 |

Making the Adhesive

The polyhydroxyether or phenoxy resin is dissolved in the diethylene glycol monobutyl ether acetate using high speed mixing until all the resin particles are dissolved. The melamine formaldehyde resin is then added. The nigrosine black and benzoic acid are mixed together and then added with high shear agitation. The high surface area silica is then added with high shear mixing. The entrained air is removed with vacuum. The viscosity of the adhesive composition measured with an RVT Viscometer at 24° C. using a number six spindle at 20rpm is 35,000 cps with a 2.5/20 rpm viscosity ratio of 4.

The prepared adhesive is screen printed in registration on top of the conductor surface of the printed circuit which is already dried. Then, the adhesive coated circuit is placed in a forced convection oven at 96° C. for 10 minutes until the adhesive coat is dry but not fully cured. The substrate after being vapor polished or dipped in the adhesion promotor is air dried and placed in a compression platen press with the release paper containing the conductor (1.0-1.2 mils dry film thickness) and the adhesive printed in registration (0.6-0.8 mils dry film thickness). Then, it is molded at 600 psi for 3 minutes at 177° C. after the release paper is stripped away.

The printed paper is dried in a forced convection oven at 96° C. for ten minutes.

A substrate is molded from a composition containing 78 weight percent of a polymer containing the following unit:

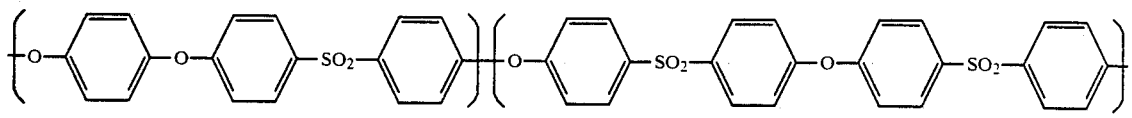

having a reduced viscosity of 0.61 dl/g as measure in N-methyl-pyrrolidinone (0.2 g/100 mil) at 25° C. The composition also contains 10 weight percent mica and 10 weight percent of chopped glass fibers obtained from Owens Corning.

The substrate composition is injection molded using conventional conditions. A 6×6 plaque which is 0.06" thick is molded. The melt temperature is 377° C., and the mold temperature is 152° C. The injection speed is 35mm/sec, and the injection molding pressure is 100 bars for 7 sec.

The substrate sheet is treated with each of the following adhesion promotors:

| Mixture | Adhesion Promotor |
|---|---|
| (A) | 100% methylene chloride vapor |
| (B) | 100% isopropanol (IPA) |
| (C) | 50% methylene chloride, 50% IPA |
| (D) | 50% methylene chloride, 48.5% IPA plus 1½% polycyclohexanone |
| (E) | 1½% resorcinol in 98.5% IPA |
| (F) | ¾% resorcinol + ¾% polycyclohexanone in 98.5% IPA |

Promotor A is used at known hot treatment conditions mentioned above. The other promotors are used at room temperature or cold bath conditions. The period of hot vapor polishing is three seconds; the period for cold bath treatment is three minutes using each of the above promotors. The ingredients are mixed together. First, the polyhydroxyether and the butyl Carbitol acetate are mixed together. Then, melamine formaldehyde is added to this mixture. Afterwards, the colorant, here nigrosine black dissolved with benzoic acid, is further added to this mixture. Then, the high surface area silica is added. At all times, the mixture is agitated with high shear using a dispersator or like mixer. The viscosity of the adhesive composition measured with an RVT Viscosity at 24° C. using a number six spindle at 20 rpm is 35,000 cps with a 2.5/20 rpm viscosity ratio of 4.

The circuit board is then cured in an oven at 150° C. for 30 minutes. After cure, the board can be soldered with a hand soldering iron or in a wave solder machine set at 246° C. with a carrier speed of 6 ft/min. The electrical resistance of a square serpentine pattern was measured with a milliohm meter. Consistent values in the range of 5-10 milliohms/mil square are obtained.

For bond strength determination, copper wires (0.05/inch diameter) are soldered onto ¼ inch diameter pads of the circuit board. After cooling, the wires are pulled from the boards clamped onto the base of a Chatillon tensile tester Model UTSM. The wires are hooked onto the end of an AMETEK ACCU Force Gage II. The circuit board is then lowered at the #1 setting of the Chatillon tester, and the maximum force is measured to break the bond between the wire and the ¼ inch pad on a 1/16 inch substrate board.

Each of the six adhesion promotor samples are tested. The results are as follows:

| Mixture | Adhesion Promotor | Adhesion | % Plugs | Appearance |
|---|---|---|---|---|
| (A) | Methylene chloride vapor | 772 psi | 81% | Very good |
| (B) | 100% IPA | 400 psi | | |
| (C) | 50% methylene chloride, 50% IPA | 885 psi | 76% | Very good |
| (D) | 50% methylene chloride, 48.5% IPA plus 1½% polycyclohexanone | 981 psi | 90% | Very good |
| (E) | 1½% resorcinol in IPA | 802 psi | | |
| (F) | ¾% resorcinol + ¾% polycyclohexanone in IPA | 825 psi | | |

If liquid methylene chloride is used at room temperature, the substrate becomes tacky and useless.

As can be seen, isopropanol unexpectedly enhances adhesion over itself or methylene chloride used alone when IPA is used in combination with the latter chloride or resorcinol. Adhesion is further enhanced when polycyclohexanone is added to the mixture.

Although the invention has been described in conjunction with specific embodiments, it is evident that many alternatives and variations will be apparent to those skilled in the art in light of the foregoing description. This may include optionally plating the printed circuit even though the circuit is solderable without this treatment. Accordingly, the invention is intended to embrace all of the alternatives and variations that fall within the spirit and scope of the appended claims.

We claim:

1. A process for promoting adhesion to a thermoplastic substrate comprising treating the substrate prior to adhesion with a composition comprising an effective concentration of isopropanol with methylene chloride to promote adhesion.

2. The process according to claim 1, wherein the composition further comprises polycyclohexanone.

3. The process according to claim 2, wherein the concentration of polycyclohexanone is about 1½% by volume of the composition.

4. The process according to claim 1, wherein the concentration of methylene chloride is at least about 50% by volume of the composition.

5. The process according to claim 1, wherein the concentration of isopropanol is less than about 50% by volume of the composition.

6. The process according to claim 1, wherein the thermoplastic substrate is a polyarylsulfone substrate.

7. The process according to claim 1, wherein the treatment occurs at room temperature.

8. The process according to claim 1, wherein the treatment occurs for about 3 minutes.

9. The process according to claim 1, wherein the substrate comprises polyarylsulfone.

10. The process according to claim 1, wherein the treated substrate is dried.

11. The process according to claim 10, wherein the treated substrate is dried under vacuum.

12. The process according to claim 1, wherein adhesion of a patterned conductor is promoted.

13. A process for promoting adhesion to a thermoplastic substrate comprising treating the substrate prior to adhesion with a composition comprising an effective concentration of isopropanol with resorcinol to promote adhesion.

14. The process according to claim 13, wherein the composition further comprises polycyclohexanone.

15. The process according to claim 14, wherein the concentration of polycyclohexanone is about ¾% by volume of the composition.

16. The process according to claim 13, wherein the concentration of resorcinol is about ¾% by volume of the composition.

17. The process according to claim 13, wherein the concentration of isopropanol is at least about 98% by volume of the composition.

18. The process according to claim 17, wherein the concentration of resorcinol is about 1½% by volume of the composition.

19. The process according to claim 13, wherein the thermoplastic substrate comprises polyarylsulfone.

20. The process according to claim 13, wherein the treatment occurs at room temperature.

21. The process according to claim 13, wherein the treatment occurs for about 3 minutes.

22. The process according to claim 13, wherein the treated substrate is dried.

23. The process according to claim 22, wherein the treated substrate is dried under vacuum.

24. The process according to claim 13, wherein adhesion of a patterned conductor is promoted.

* * * * *